United States Patent
Wang et al.

(10) Patent No.: US 10,937,559 B2
(45) Date of Patent: Mar. 2, 2021

(54) MICRO DEVICE TRANSFERRING APPARATUS AND MICRO DEVICE TRANSFERRING METHOD

(71) Applicant: BOE Technology Group Co., Ltd., Beijing (CN)

(72) Inventors: Fei Wang, Beijing (CN); Huijuan Wang, Beijing (CN); Wanxian Xu, Beijing (CN); Xuan Liang, Beijing (CN); Meili Wang, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 16/553,885

(22) Filed: Aug. 28, 2019

(65) Prior Publication Data

US 2020/0286639 A1 Sep. 10, 2020

(30) Foreign Application Priority Data

Mar. 8, 2019 (CN) .......................... 201910175804.8

(51) Int. Cl.
*G21K 1/00* (2006.01)
*G02B 1/00* (2006.01)
(Continued)

(52) U.S. Cl.
CPC ............... *G21K 1/006* (2013.01); *G02B 1/00* (2013.01); *H01L 21/67144* (2013.01);
(Continued)

(58) Field of Classification Search
CPC ........ G21K 1/006; G02B 1/00; H01L 21/681; H01L 21/67144; H01L 24/83; H01L 24/97
(Continued)

(56) References Cited

U.S. PATENT DOCUMENTS

2017/0330857 A1 11/2017 Zou et al.
2017/0338374 A1 11/2017 Zou et al.
(Continued)

FOREIGN PATENT DOCUMENTS

CN   1830752 A    9/2006
CN   107889540 A  4/2018
(Continued)

OTHER PUBLICATIONS

First Chinese Office Action issued in corresponding Chinese Patent Application No. 201910175804.8 dated Aug. 25, 2020.
(Continued)

*Primary Examiner* — Kiet T Nguyen
(74) *Attorney, Agent, or Firm* — Arent Fox LLP; Michael Fainberg

(57) ABSTRACT

A micro device transferring apparatus and a micro device transferring method are provided. The micro device transferring apparatus for moving a micro device fixed on an original substrate to a target substrate includes: a stripper on a side of the original substrate away from the micro device, configured to strip the micro device off the original substrate, and an optical tweezer configured to tweeze the micro device from a side of the original substrate provided with the micro device, wherein an accommodating space for accommodating the micro device and the original substrate is between the stripper and the optical tweezer.

10 Claims, 2 Drawing Sheets

(51) Int. Cl.
*H01L 23/00* (2006.01)
*H01L 21/67* (2006.01)
*H01L 21/68* (2006.01)

(52) U.S. Cl.
CPC ............ *H01L 21/681* (2013.01); *H01L 24/83* (2013.01); *H01L 24/97* (2013.01)

(58) Field of Classification Search
USPC .............................................. 250/492.2, 251
See application file for complete search history.

(56) References Cited

U.S. PATENT DOCUMENTS

2018/0045985 A1* 2/2018 Eash ...................... G02F 1/0136
2019/0393066 A1   12/2019 Hong

FOREIGN PATENT DOCUMENTS

| CN | 107924866 A | 4/2018 |
| CN | 108346606 A | 7/2018 |
| CN | 108962789 A | 12/2018 |

OTHER PUBLICATIONS

The charm of photons, Chief Editor Lei Shizan, Chen Gang, Published by Shanghai Jiao Tong University Press dated Jan. 1, 2015.

* cited by examiner

MICRO DEVICE TRANSFERRING APPARATUS AND MICRO DEVICE TRANSFERRING METHOD

CROSS-REFERENCES TO RELATED APPLICATION

This application claims priority to Chinese patent application No. 201910175804.8 filed on Mar. 8, 2019, which is incorporated herein by reference in its entirety.

FIELD

The present disclosure relates to the field of micro devices, and particularly to a micro device transferring apparatus and a micro device transferring method.

BACKGROUND

At present, the electronic devices, e.g., micro chips, micro light-emitting diodes, etc., are increasingly integrated and miniaturized, but it is more difficult to fabricate and assemble them as their performance or operating capacity is improving. It is impossible for a grabber using a vacuum-sucking head in the related art to grab a device with a size of hundreds of micrometers and less at satisfactory precision.

SUMMARY

In one aspect, an embodiment of the disclosure provides a micro device transferring apparatus for moving a micro device fixed on an original substrate to a target substrate. The apparatus includes: a stripper on a side of the original substrate away from the micro device, configured to strip the micro device off the original substrate, and an optical tweezer configured to tweeze the micro device from a side of the original substrate provided with the micro device, wherein an accommodating space for accommodating the micro device and the original substrate is between the stripper and the optical tweezer.

In some embodiments, the optical tweezer is a laser optical tweezer.

In some embodiments, the micro device transferring apparatus further includes an auxiliary substrate configured to assist in transferring the micro device, and a powering device configured to move the auxiliary substrate, wherein the auxiliary substrate is between the micro device and the optical tweezer, and a surface of the auxiliary substrate facing the micro device is configured to contact with the micro device.

In some embodiments, the material of the auxiliary substrate is transparent plastic or glass.

In some embodiments, the surface of the auxiliary substrate facing the micro device is provided with a bonding layer for bonding the micro device, and the micro device is bonded with the auxiliary substrate through the bonding layer.

In some embodiments, the surface of the auxiliary substrate facing the micro device is configured to contact with the micro device by a force applied by the optical tweezer through the auxiliary substrate to the micro device.

In some embodiments, a pressuring plate is between the optical tweezer and the auxiliary substrate, and the pressuring plate is configured to apply a force to the auxiliary substrate in a direction toward the micro device.

In some embodiments, the stripper is a laser stripper.

In another aspect, an embodiment of the disclosure provides a micro device transferring method. The method includes: stripping a micro device off an original substrate using a stripper on a side of the original substrate away from the micro device; moving the micro device separate from the original substrate to a target substrate using an optical tweezer on a side of the micro device away from the original substrate; and fixing the micro device on the target substrate using a connection material on the target substrate.

In some embodiments, the connection material is a bonding agent, tin paste, silver slurry, or metal.

DETAILED DESCRIPTION

The technical solutions according to the embodiments of the disclosure will be described below clearly and fully with reference to the drawings in the embodiments of the disclosure. Apparently the embodiments to be described are only a part but not all of the embodiments of the disclosure. Based upon the embodiments here of the disclosure, all of other embodiments which can occur to those ordinarily skilled in the art without any inventive effort shall come into the claimed scope of the disclosure.

Embodiments of the disclosure provide a micro device transferring apparatus and a micro device transferring method so as to transfer a micro device with a size of hundreds of nanometers to tens of micrometers precisely.

Figure 1A:
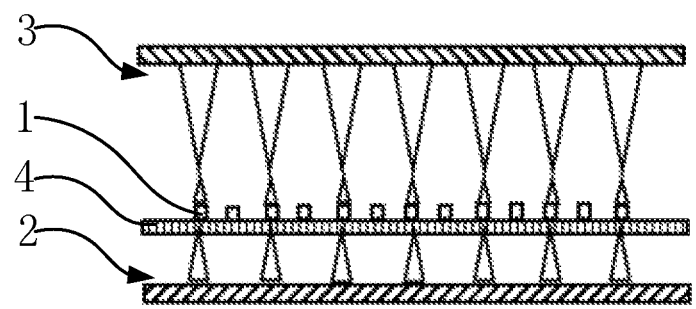
FIG. 1A is a schematic structural diagram of a micro device transferring apparatus according to an embodiment of the disclosure, which is applicable to an original substrate.
Figure 1B:
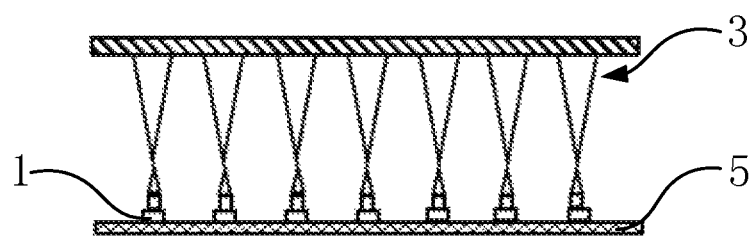
FIG. 1B is a schematic structural diagram of a micro device transferring apparatus according to an embodiment of the disclosure, which is applicable to a target substrate.

As illustrated in FIG. 1A and FIG. 1B, a micro device transferring apparatus according to an embodiment of the disclosure is configured to move a micro device 1 fixed on an original substrate 4 to a target substrate 5. The micro device transferring apparatus includes: a stripper 2 on the side of the original substrate 4 away from the micro device configured to strip the micro device 1 off the original substrate 4, and an optical tweezer 3 configured to tweeze the micro device 1 from the side of the original substrate 4 provided with the micro device 1, where an accommodating space for accommodating the micro device 1 and the original substrate 4 is formed between the stripper 2 and the optical tweezer 3.

The micro device transferring apparatus above is configured to strip the micro device 1 fixed on the original substrate 4 off the original substrate 4, and to move the micro device 1 to the target substrate 5, and the micro device transferring apparatus includes the stripper 2 and the optical tweezer 3, the accommodating space for accommodating the micro device 1 and the original substrate 4 is formed between the stripper 2 and the optical tweezer 3, the stripper 2 applies a force to the micro device 1 from the side of the original substrate 4 away from the micro device 1, and strips the micro device 1 off the original substrate 4, and the optical tweezer 3 tweezes the micro device 1 separate from the original substrate 4 to the target substrate 5. In operation, firstly the original substrate 4 carrying the micro device 1 is placed in the accommodating space so that the micro device 1 is located proximate to the optical tweezer 3 side, and the original substrate 4 is located proximate to the stripper 2 side, then the stripper 2 strips the micro device 1 off the original substrate 4 so that the micro device 1 is separate from the original substrate 4, and finally the optical tweezer 3 tweezes the micro device 1, and moves the micro device 1 onto the target substrate 5, so that the micro device 1 is transferred. The micro device is tweezed using the optical tweezer in the micro device transferring apparatus above, and as compared with the related art in which a micro device is grabbed using a vacuum sucking head or another mechanical instrument, the micro device transferring apparatus according to the embodiment of the disclosure has higher precision, can be applicable to the micro device 1 with a size of hundreds of nanometers to tens of micrometers, and can transfer the micro device 1 precisely, thus greatly facilitating operational transfer of the micro device 1.

In some embodiments, the stripper is a laser stripper 2. The micro device 1 is originally fixed on the original substrate 4, the laser stripper 2 can provide a focused laser beam, to strip the micro device 1 off the original substrate 4.

In some embodiments, the optical tweezer 3 is a laser optical tweezer 3. The laser optical tweezer 3 can provide a focused laser beam to trap the micro device 1, the laser optical tweezer 3 lifts the micro device 1 by applying a pulling force to the micro device 1 towards to the optical tweezer 3. The optical tweezer 3 lifts the micro device 1 and then moves to the target substrate 5, and places the micro device 1 on the target substrate 5. The connection material is arranged on the target substrate, and the connection material can be a bonding agent, tin paste, silver slurry, metal, or another metal, and can fix the micro device 1, or even electrically connect the micro device.

Figure 2A:
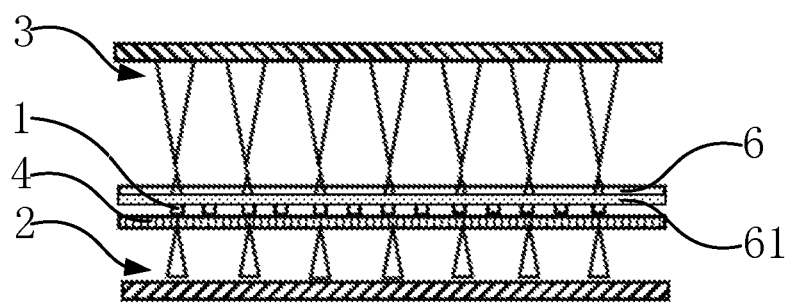
FIG. 2A is a schematic structural diagram of another micro device transferring apparatus according to an embodiment of the disclosure, which is applicable to an original substrate.
Figure 2B:
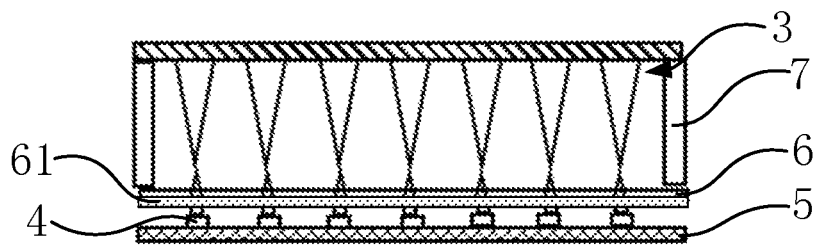
FIG. 2B is a schematic structural diagram of another micro device transferring apparatus according to an embodiment of the disclosure, which is applicable to a target substrate.

In some embodiments, as illustrated in FIG. 2A and FIG. 2B, the micro device transferring apparatus above further includes an auxiliary substrate 6 configured to assist in transferring the micro device 1, and a powering device configured to move the auxiliary substrate 6, where the auxiliary substrate 6 is arranged between the micro device 1 and the optical tweezer 3, and the surface of the auxiliary substrate 6 facing the micro device 1 is configured to contact with the micro device 1.

The auxiliary substrate 6 assists in transferring the micro device 1, and is arranged between the micro device 1 and the optical tweezer 3, and since the side of the auxiliary substrate 6 facing the micro device 1 contacts with the micro device 1 while the micro device 1 is being moved, the micro device 1 being moved is fixed in position in the direction perpendicular to the surface of the auxiliary substrate 6, thus improving the stability of the micro device 1 being transferred.

In some embodiments, the material of the auxiliary substrate 6 is transparent plastic or glass.

The material of the auxiliary substrate 6 is a transparent material through which laser of the optical tweezer 3 can be transmitted, e.g., plastic, glass, or another material.

In some embodiments, a bonding layer 61 for bonding the micro device 1 is arranged on one surface of the auxiliary substrate 6, and the micro device 1 is bonded with the auxiliary substrate 6 through the bonding layer 61.

The bonding layer for bonding the micro device 1 to fix the micro device 1 is arranged on the surface of the auxiliary substrate 6 facing the micro device 1, and the bonding layer can have some viscosity so that the micro device 1 can fall off freely when the optical tweezer 3 does not apply any force to the micro device 1, or the bonding layer can be an electrically bonding layer with a viscosity varying under the action of an electric field, where the bonding layer can be changed between a liquid state and a solid state under the action of the electric field, and the viscosity of the bonding layer increases with the increasing intensity of the electric field; and the viscosity of the bonding layer in the solid state is higher than the viscosity thereof in the liquid state, so after the micro device 1 is aligned with the target substrate 5, the micro device 1 can fall off the auxiliary substrate 6 as the viscosity of the electrically bonding layer is lowered.

In some embodiments, the surface of the auxiliary substrate 6 facing the micro device 1 is configured to contact with the micro device 1 by the force applied by the optical tweezer 3 through the auxiliary substrate to the micro device 1.

When the auxiliary substrate 6 is not provided with any bonding layer, the micro device 1 can be fit on the auxiliary substrate 6 by the force applied by the optical tweezer 3 to the micro device 1, and the auxiliary substrate 6 can restrict the position of the micro device 1 in the direction perpendicular to the auxiliary substrate to thereby improve the stability of the micro device being transferred.

In some embodiments, as illustrated in FIG. 2B, a pressuring plate 7 is arranged between the optical tweezer 3 and the auxiliary substrate 6 to apply a force to the auxiliary substrate 6 in the direction toward the micro device 1.

In some case, some pressure shall be applied to the connection between the micro device 1 and the target substrate 5, so the pressuring plate 7 is arranged between the optical tweezer 3 and the auxiliary substrate 6 to pressurize the auxiliary substrate 6 to thereby make the connection between the micro device 1 and the target substrate 5 more reliable.

In some embodiments, the pressuring plate 7 can pressurize the auxiliary substrate as follows: the pressuring plate 7 is controlled using an external power source to pressurize the auxiliary substrate, where the external power source can be a cylinder, a motor, etc., or the optical tweezer 3 can contact with the pressuring plate 7 to thereby apply a mechanical pressure to the pressuring plate 7, which passes the pressure to the auxiliary substrate 6 to pressurize the auxiliary substrate 6.

Figure 3:
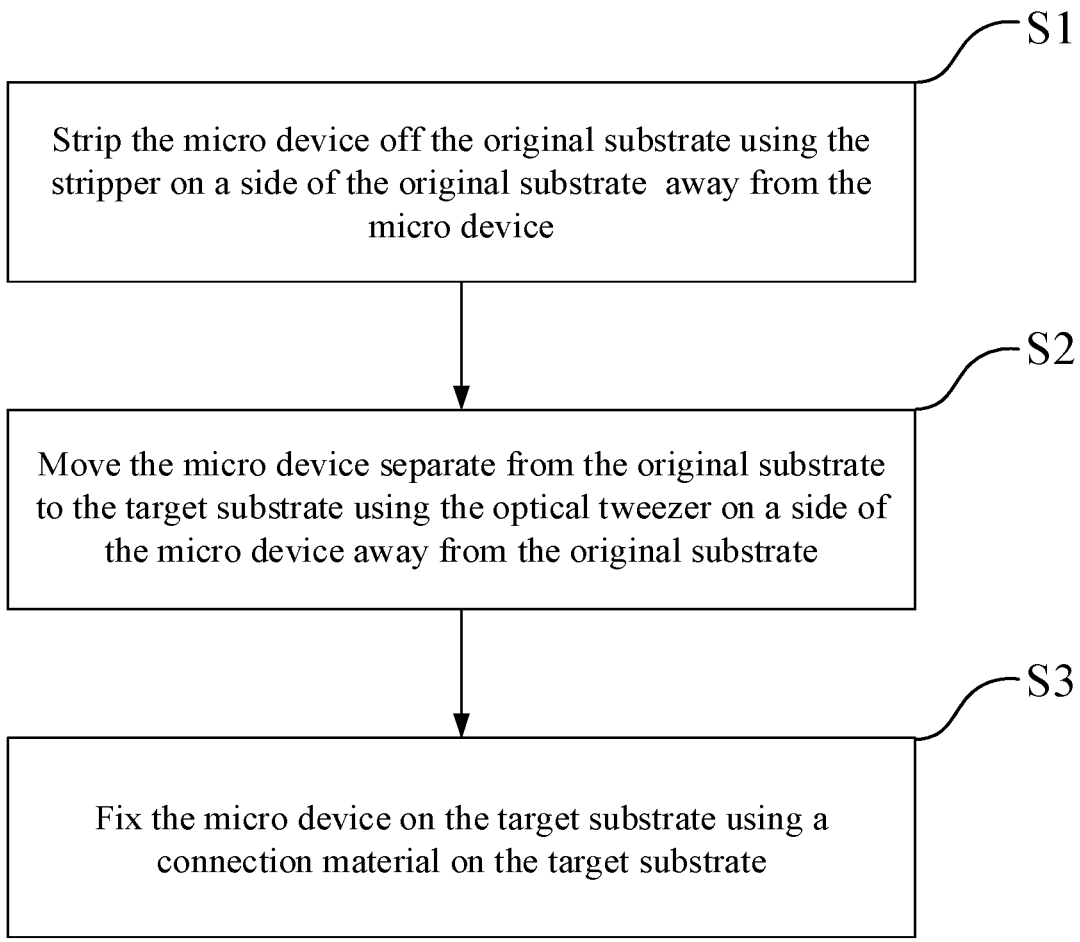
FIG. 3 is a flow chart of a micro device transferring method according to an embodiment of the disclosure.

In another aspect, an embodiment of the disclosure further provides a micro device transferring method includes the following steps as illustrated in FIG. 3.

The step S1 is to strip the micro device 1 off the original substrate 4 using the stripper 2 on a side of the original substrate 4 away from the micro device 1.

The step S2 is to move the micro device 1 separate from the original substrate 4 to the target substrate 5 using the optical tweezer on a side of the micro device 1 away from the original substrate 4.

The step S3 is to fix the micro device 1 on the target substrate 5 using a connection material on the target substrate 5.

In the micro device transferring method above, the micro device 1 is transferred from the original substrate 4 to the target substrate 5 using the micro device transferring apparatus according to the embodiment of the disclosure, and this method can be commonly applicable to the micro device 1 with a size of hundreds of nanometers to tens of micrometers, and can transfer the micro device 1 precisely.

In some embodiments, the connection material is a bonding agent, tin paste, silver slurry, or metal.

The micro device 1 is fixed on the target substrate 5 using the connection material on the target substrate 5, and the connection material can be a bonding agent, tin paste, silver slurry, metal, or another metal, and can fix the micro device 1; and when the connection material is selected from tin paste, silver slurry, metal, or another conductive material, the connection material can fix but also electrically connect the micro device.

While the micro device 1 being transferred using the micro device transferring apparatus according to the embodiment of the disclosure, the micro device 1 can be tweezed and transferred in a liquid environment to thereby lower a required tweezing force, and specifically the micro device transferring apparatus shall be placed in the liquid environment on the premise that the direction of the force of the optical tweezer 3 upon the micro device 1 is the same as the direction of a floating force of the liquid upon the micro device 1, and in this way, there is a specific gravity of the micro device 1 in the liquid or the air, so the force required for the optical tweezer 3 to tweeze the micro device 1 can be lowered due to the floating force in the liquid.

The micro device transferring apparatus above is configured to strip the micro device fixed on the original substrate off the original substrate, and to move the micro device to the target substrate, and the micro device transferring apparatus includes the stripper and the optical tweezer, the accommodating space for accommodating the micro device and the original substrate is formed between the stripper and the optical tweezer, the stripper applies a force to the micro device from the side of the original substrate away from the micro device, and strips the micro device off the original substrate, and the optical tweezer tweezes the micro device separate from the original substrate onto the target substrate; and in operation, firstly the original substrate carrying the micro device is placed in the accommodating space so that the micro device is located proximate to the optical tweezer side, and the original substrate is located proximate to the stripper side, then the stripper strips the micro device off the original substrate so that the micro device is separate from the original substrate, and finally the optical tweezer tweezes the micro device, and moves the micro device onto the target substrate, so that the micro device is transferred. The micro device is tweezed using the optical tweezer in the micro device transferring apparatus above, and as compared with the related art in which a micro device is grabbed using a vacuum sucking head or another mechanical instrument, the micro device transferring apparatus according to the embodiment of the disclosure has higher precision, can be applicable to the micro device with a size of hundreds of nanometers to tens of micrometers, and can transfer the micro device precisely, thus greatly facilitating operational transfer of the micro device.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A micro device transferring apparatus for moving a micro device fixed on an original substrate to a target substrate, the apparatus comprising:
    a stripper on a side of the original substrate away from the micro device, configured to strip the micro device off the original substrate; and
    an optical tweezer configured to tweeze the micro device from a side of the original substrate provided with the micro device, wherein an accommodating space between the stripper and the optical tweezer is for accommodating the micro device and the original substrate.

2. The micro device transferring apparatus according to claim 1, wherein the optical tweezer is a laser optical tweezer.

3. The micro device transferring apparatus according to claim 1, further comprising:
    an auxiliary substrate configured to assist in transferring the micro device;
    wherein the auxiliary substrate is between the micro device and the optical tweezer, and a surface of the auxiliary substrate facing the micro device is configured to contact with the micro device.

4. The micro device transferring apparatus according to claim 3, wherein a material of the auxiliary substrate is transparent plastic or glass.

5. The micro device transferring apparatus according to claim 4, wherein the surface of the auxiliary substrate facing the micro device is provided with a bonding layer for bonding the micro device, and the micro device is bonded with the auxiliary substrate through the bonding layer.

6. The micro device transferring apparatus according to claim 4, wherein the surface of the auxiliary substrate facing the micro device is configured to contact with the micro device by a force applied by the optical tweezer through the auxiliary substrate to micro device.

7. The micro device transferring apparatus according to claim 3, wherein a pressuring plate is between the optical tweezer and the auxiliary substrate, and the pressuring plate is configured to apply a force to the auxiliary substrate in a direction toward the micro device.

8. The micro device transferring apparatus according to claim 1, wherein the stripper is a laser stripper.

9. A micro device transferring method, comprising:
    stripping a micro device off an original substrate using a stripper on a side of the original substrate away from the micro device;
    moving the micro device separated from the original substrate to a target substrate using an optical tweezer on a side of the micro device away from the original substrate; and
    fixing the micro device on the target substrate using a connection material on the target substrate.

10. The micro device transferring method according to claim 9, wherein the connection material is a bonding agent, tin paste, silver slurry, or metal.

* * * * *